United States Patent
Cook et al.

[11] Patent Number: 6,075,805
[45] Date of Patent: Jun. 13, 2000

[54] APPARATUS FOR LINEWIDTH REDUCTION IN DISTRIBUTED FEEDBACK OR DISTRIBUTED BRAGG REFLECTOR SEMICONDUCTOR LASERS USING VERTICAL EMISSION

[75] Inventors: Anthony L. Cook, Hampton; Herbert D. Hendricks, Poquoson, both of Va.

[73] Assignee: The United States of American as represented by the Administrator of the National Aeronautics and Space Administration, Washington, D.C.

[21] Appl. No.: 09/179,731

[22] Filed: Oct. 27, 1998

Related U.S. Application Data

[62] Division of application No. 08/549,347, Oct. 26, 1995, Pat. No. 5,828,688.

[51] Int. Cl.⁷ ............... H01S 3/08; H01S 3/13; H01S 3/04
[52] U.S. Cl. .................. 372/96; 29/32; 29/36; 29/102
[58] Field of Search .............. 372/29, 32, 36, 372/50, 92, 96, 102; 369/112

[56] References Cited

U.S. PATENT DOCUMENTS

| 5,111,467 | 5/1992 | Bradley | 372/32 |
| 5,381,395 | 1/1995 | Okada | 369/112 |

FOREIGN PATENT DOCUMENTS 3-135088   6/1991   Japan .

*Primary Examiner*—Teresa M. Arroyo
*Assistant Examiner*—Quyen P. Leung
*Attorney, Agent, or Firm*—Robin W Edwards

[57] ABSTRACT

The linewidth of a distributed feedback semiconductor laser or a distributed Bragg reflector laser having one or more second order gratings is reduced by using an external cavity to couple the vertical emission back into the laser. This method and device prevent disturbance of the main laser beam, provide unobstructed access to laser emission for the formation of the external cavity, and do not require a very narrow heat sink. Any distributed Bragg reflector semiconductor laser or distributed feedback semiconductor laser that can produce a vertical emission through the epitaxial material and through a window in the top metallization can be used. The external cavity can be formed with an optical fiber or with a lens and a mirror or grating.

4 Claims, 12 Drawing Sheets a
APPARATUS FOR LINEWIDTH REDUCTION IN DISTRIBUTED FEEDBACK OR DISTRIBUTED BRAGG REFLECTOR SEMICONDUCTOR LASERS USING VERTICAL EMISSION

This application is a divisional patent application of commonly owned, patent application Ser. No. 08/549,347, filed Oct. 26, 1995 now U.S. Pat. No. 5,828,688.

ORIGIN OF THE INVENTION

The invention described herein was made by an employee of the United States Government and may be manufactured and used by the government for governmental purposes without the payment of any royalties thereon or therefore.

TECHNICAL FIELD

This invention relates generally to linewidth narrowing of semiconductor lasers. More particularly, the present invention relates to a method and an apparatus for reducing the linewidth of a distributed feedback (DFB) or distributed Bragg reflector (DBR) semiconductor laser having one or more second order gratings by using an external cavity to couple the vertical emission back into the laser.

BACKGROUND ART

The natural, or solitary, linewidth of a semiconductor laser is the linewidth the laser exhibits when it is operating with no external optical or electrical feedback present. Most single-spectral-mode semiconductor diode lasers that are readily available today have natural linewidths greater than a few megahertz. Typical values range from 5 MHz to 100 MHz. Narrow linewidth sources, however, are essential for optical systems such as coherent optical communications and optical sensors.

To accomplish linewidth narrowing in semiconductor lasers, it is necessary to couple light emitted from the laser back into the laser cavity. The front or rear facet emission has been used previously to couple reflected light back into the laser cavity. Utilization of the light from the front facet, as illustrated by the two examples in FIGS. 1A and 1B, either disturbs and/or attenuates the main beam of interest in the optical system. Utilization of the light from the rear facet, as illustrated by the two examples in FIGS. 2A and 2B, requires the laser to be mounted on a special narrow heat sink to allow unobstructed access to the rear facet emission. Most linewidth narrowing systems using front or rear emission have utilized either a Fabry-Perot semiconductor laser or a distributed feedback semiconductor laser as the active element. U.S. Pat. No. 4,955,028 discloses a wavelength tunable laser that uses an optical fiber coupled to the edge emission.

U.S. Pat. Nos. 5,109,386 and 5,111,467 disclose the use of vertical emission for stabilizing the wavelength of a distributed Bragg reflector laser using wavelength selective feedback to the laser by means of a rugate filter placed above the vertical emission.

The novelty of the present invention is the use of vertical emission for linewidth narrowing of DFB and DBR semiconductor lasers.

STATEMENT OF INVENTION

Accordingly, one object of the invention is to provide linewidth narrowing of DFB and DBR semiconductor lasers.

Another object is to provide linewidth narrowing of DFB and DBR semiconductor lasers without using a very narrow heat sink.

A further object of the invention is to prevent disturbance of the main laser beam in any way.

Another object is to provide nonobstructed access to laser emission for the formation of the external cavity.

Still another object of the invention is to provide linewidth narrowing of DFB and DBR semiconductor lasers by the use of an external cavity formed with vertical emission from the semiconductor laser.

Yet another object is to allow unobstructed access to laser emission for formation of an external cavity with high power and/or more complex semiconductor laser structures that require large heat sinks.

Additional objects and advantages of the present invention are apparent from the drawings and specification which follow.

SUMMARY OF THE INVENTION

The present invention is a method and a device for reducing the spectral linewidth of a semiconductor laser that contains a second order grating. The effective cavity length of the semiconductor laser is increased by coupling a portion of the vertical light emission into an external cavity. Since the linewidth decreases as the cavity length increases, the spectral linewidth of the laser emission is reduced. The laser has a second order grating grown epitaxially as part of the laser structure. An edge emitting second order grating laser has both front and rear emission as well as vertical emission from the top of the laser. The laser light is emitted through a vertical window in the semiconductor laser, travels through the external cavity, and is reflected back by the external cavity into the second order grating where it is coupled to the original laser light. The amount of feedback coupling is used to control the amount of linewidth reduction. As compared to using the front or rear edge emission, vertical emission provides easy and unobstructed access to laser emission for the formation of the external cavity.

Previous coupling methods had to reflect the light through either the front or rear face of the semiconductor laser. Front or rear emission requires special mounting in order to avoid interference between the feedback beam and the main beam. Unlike rear emission access, the use of vertical emission eliminates the requirement of a special very narrow heat sink. Also, unlike front facet access, the use of vertical emission prevents disturbance of the main laser beam in any way. The configuration of this invention also allows the easiest access for formation of external cavities with high-power and/or more complex semiconductor laser structures that require large heat sinks. For example, this technique could be used with a master oscillator power amplifier semiconductor laser (MOPA), which cannot be mounted on a narrow heat sink for power dissipation reasons and which has a more complex front facet beam structure. Any DBR semiconductor laser or DFB semiconductor laser that can produce a vertical emission through the epitaxial material and through a window in the top metallization can be used.

BRIEF DESCRIPTION OF THE DRAWINGS

A more complete appreciation of the invention and the many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
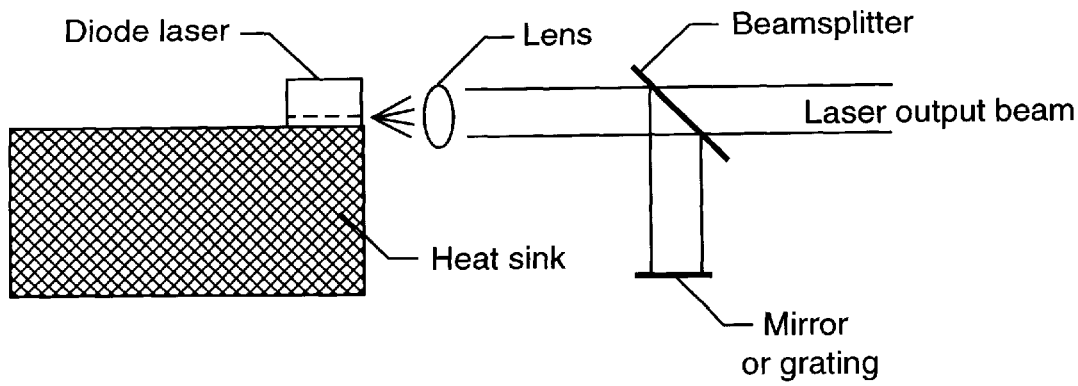
FIG. 1A illustrates the use of front facet emission using a mirror or grating and a beamsplitter.
Figure 1B:
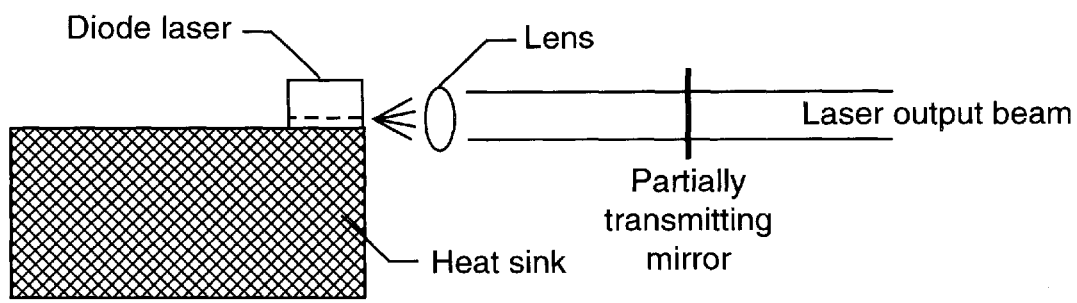
FIG. 1B illustrates the use of front facet emission using a partially transmitting mirror.
Figure 2A:
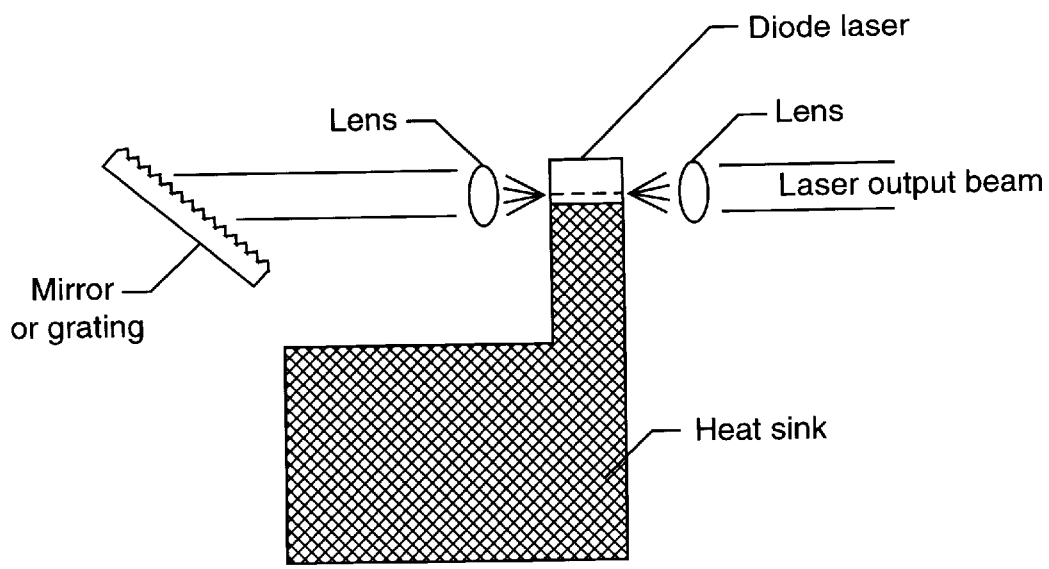
FIG. 2A illustrates the use of rear facet emission using a mirror or grating.
Figure 2B:
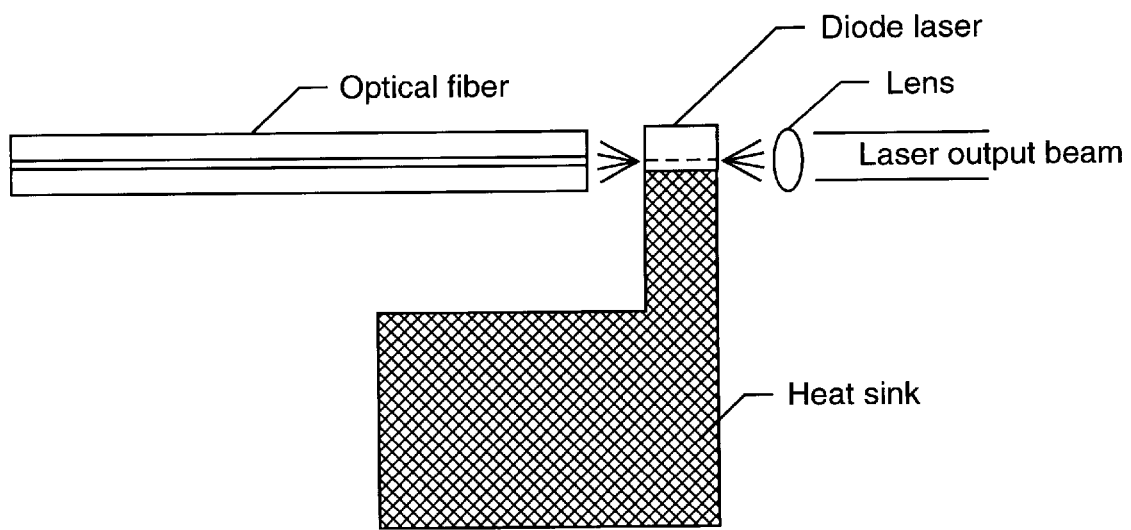
FIG. 2B illustrates the use of rear facet emission using an optical fiber.
Figure 3:
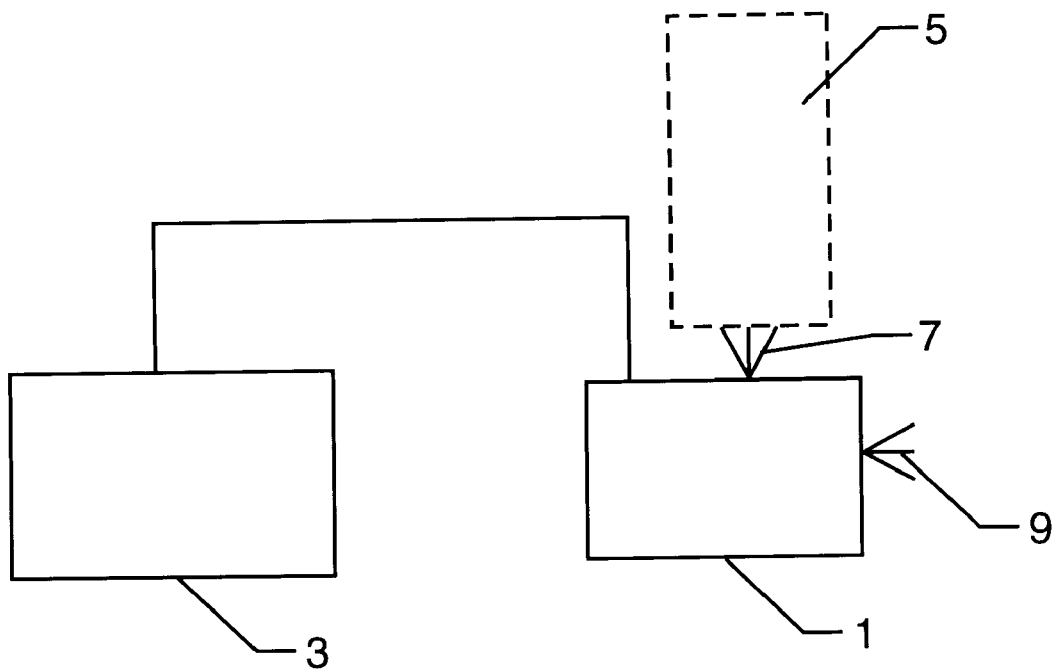
FIG. 3 illustrates a laser set-up in accordance with the principles of the present invention.

FIG. 3 shows a laser set-up in accordance with the principles of the present invention. A dc current source 3 supplies current to a DFB or DBR semiconductor laser 1. The vertically emitted light 7 travels through the external cavity 5 and is reflected back by the external cavity into the laser 1 where it is coupled to the original laser light. The front emission 9 is used to form the laser output beam.

Figure 4:
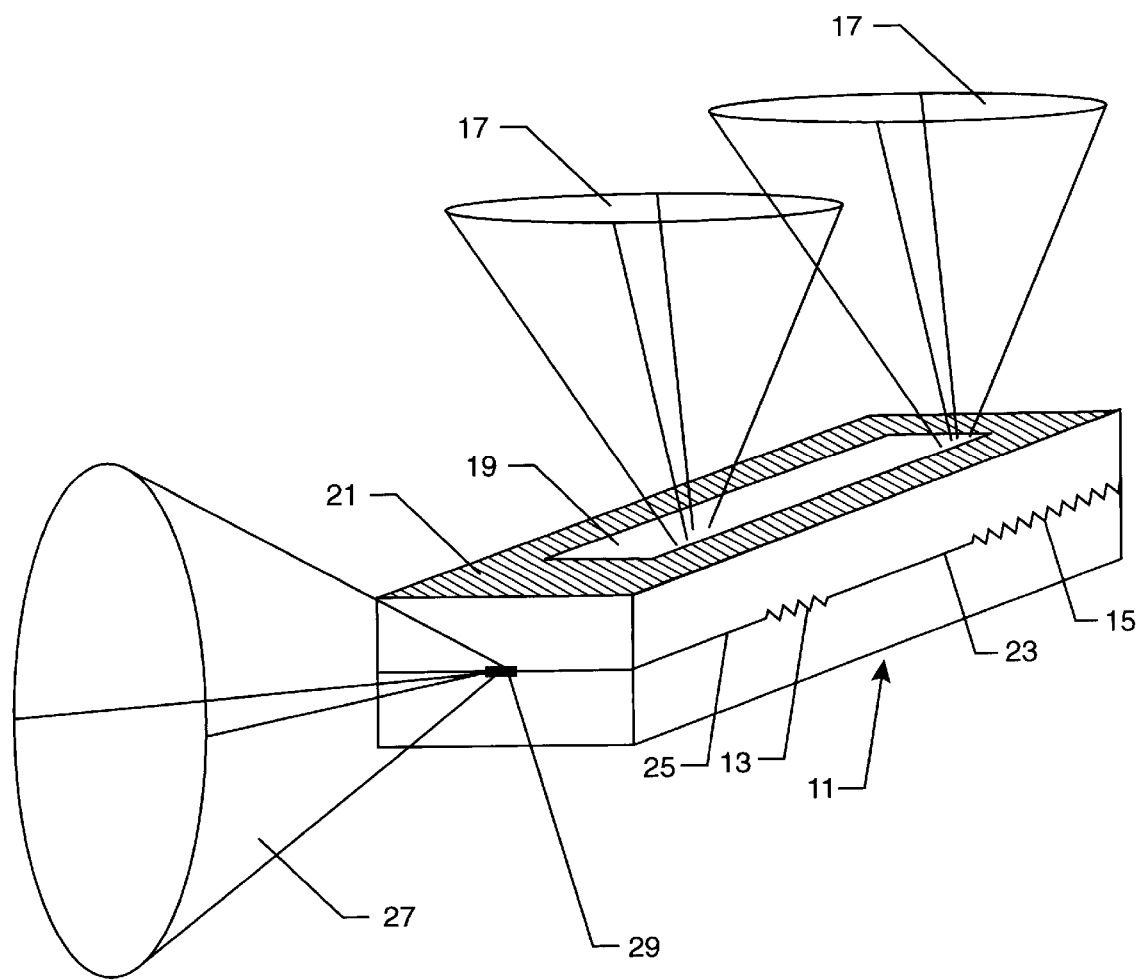
FIG. 4 shows an exemplary semiconductor laser of the present invention.

FIG. 4 is an exemplary semiconductor laser of the present invention. Although a DBR semiconductor laser 11 is shown, any DBR semiconductor laser or DFB semiconductor laser that can produce a vertical emission 17 through a window 19 in the top metallization 21 can be used, i.e., transparency from the grating through the top metallization of the laser is required. For example, this technique could be used with a distributed Bragg MOPA semiconductor laser or a distributed feedback MOPA semiconductor laser.

Figure 5A:
FIG. 5A shows a top view of a single window configuration for a single grating DBR semiconductor laser.
Figure 5B:
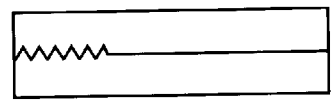
FIG. 5B shows a side view of a single window configuration for a single grating DBR semiconductor laser.
Figure 6A:
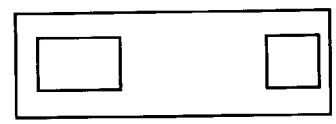
FIG. 6A shows a top view of a two-window configuration for a DBR semiconductor laser having two gratings.
Figure 6B:
FIG. 6B shows a side view of a two-window configuration for a DBR semiconductor laser having two gratings.
Figure 7A:
FIG. 7A shows a top view of a single window configuration for a DBR semiconductor laser having two gratings.
Figure 7B:
FIG. 7B shows a side view of a single window configuration for a DBR semiconductor laser having two gratings.
Figure 8A:
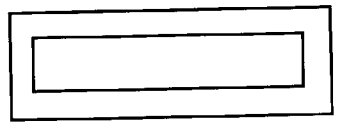
FIG. 8A shows a top view of a single continuous window configuration for a DBR semiconductor laser having two gratings.
Figure 8B:
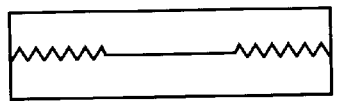
FIG. 8B shows a side view of a single continuous window configuration for a DBR semiconductor laser having two gratings.
Figure 9A:
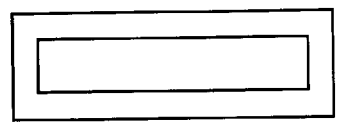
FIG. 9A shows a top view of a single continuous window configuration for a DFB semiconductor laser.
Figure 9B:
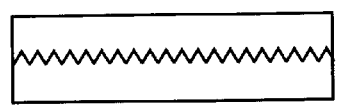
FIG. 9B shows side view of a single continuous window configuration for a DFB semiconductor laser.
Figure 10A:
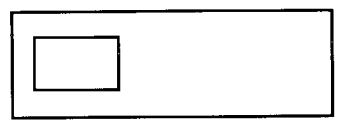
FIG. 10A shows a top view of a single window configuration for a DFB semiconductor laser.
Figure 10B:
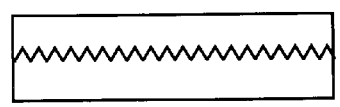
FIG. 10B shows a side view of a single window configuration for a DFB semiconductor laser.

The distributed Bragg reflector laser 11 has two second order gratings 13 and 15 grown epitaxially as part of the laser structure. Each second order grating 13 and 15 has vertical emission 17 as well as edge emission 27. The vertical emission 17 from each second order grating 13 and 15 exits the semiconductor laser 11 through a window 19 in the metallized contact 21 of the laser 11. Any suitable method of window formation can be used, such as masking and etching. A gain section 23 is positioned between the two gratings, as is typical in distributed Bragg reflector semiconductor lasers. A preamplifier section 25 can also be incorporated but is not necessary. Whether a preamplifier is used depends on the system output power desired. DBR semiconductor lasers have one or two gratings separated from a gain section. For one grating, the most advantageous placement of the window would be above the grating, as shown in FIGS. 5A and 5B. For two gratings, any of several window configurations could be utilized. For example, a window could be positioned above each grating, as shown in FIGS. 6A and 6B. Alternatively, one window could be positioned above only one of the gratings, as shown in FIGS. 7A and 7B, since light from only one of the gratings is necessary for linewidth narrowing. As a third alternative, one continuous window could be positioned above both gratings, as shown in FIGS. 8A and 8B. A DFB semiconductor laser has one continuous grating along the entire length of the laser cavity. One continuous window could be formed in the metallized contact, as shown in FIGS. 9A and 9B, or a single smaller window could be formed, as shown in FIGS. 10A and 10B, since all of the vertical emission cannot be intercepted by the external cavity.

The only limitation on the laser length is what practically can be grown epitaxially. In addition, other higher order gratings, such as fourth order or sixteenth order, could also be used to produce vertical emission; however, they are generally not manufactured and are not recommended due the their inefficiency. There are also no limitations on the laser emission wavelength. The typical wavelength of semiconductor lasers can range, for example, from 400 nm to 4000 nm. The front edge emission 27 exiting through aperture 29 is used to form the laser output beam.

Figure 11:
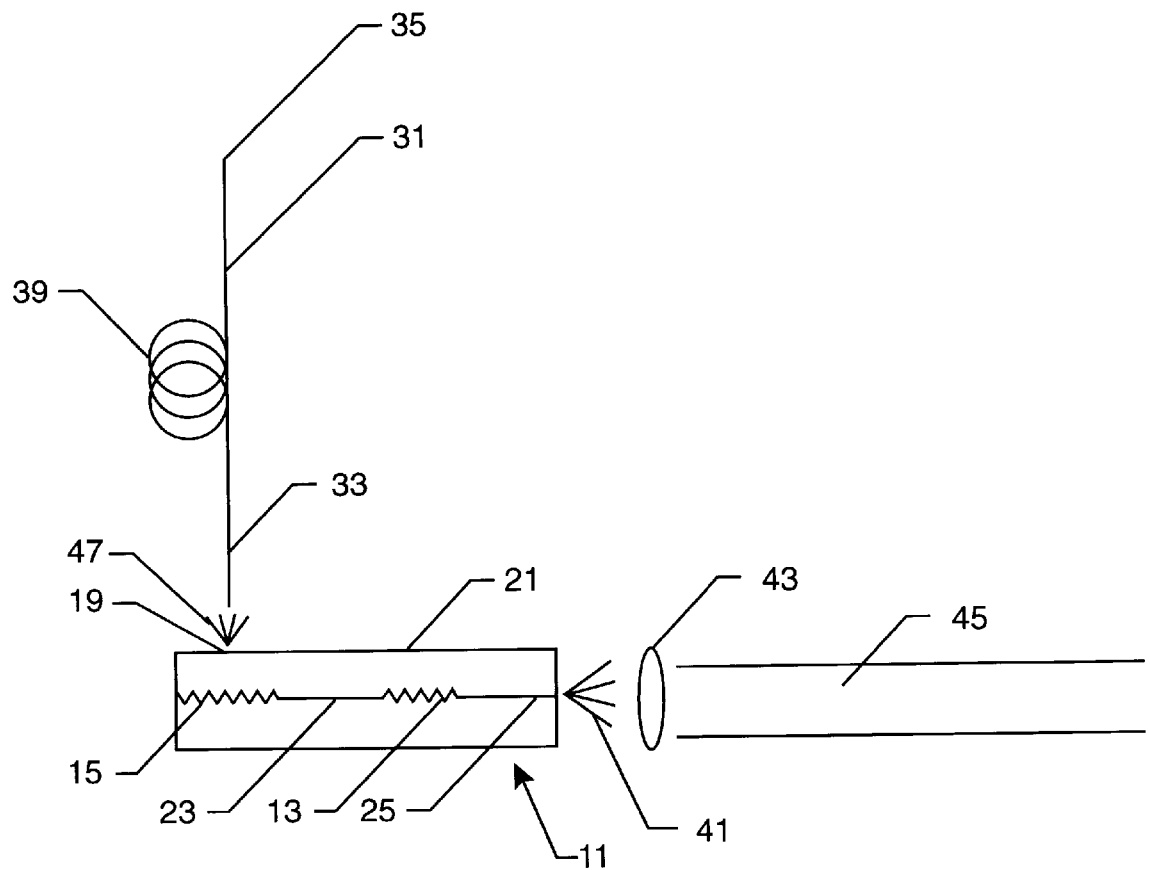
FIG. 11 is an exemplary semiconductor laser set-up having an optical fiber external cavity.

FIG. 11 is an exemplary linewidth narrowing semiconductor laser set-up. The external cavity is formed by bringing an optical fiber 31 substantially perpendicular to and in close proximity to the window 19 in the metallized contact 21 of the laser in order to couple optical power into the fiber. A loss in coupling efficiency occurs if the fiber 31 is not perpendicular to the emission to be coupled. More power coupling results as the fiber 31 is positioned closer to the top surface of the laser. However, the fiber 31 should not touch the laser due to the risk of damaging the laser. Standard optical fibers can be used and specific examples will be discussed later. Typically the fiber 31 should be tens of microns from the top surface 19 of the laser. At approximately 100 microns, the linewidth begins to drastically broaden. The fiber 31 can be wound 39 to lessen the space requirement. Both ends 33 and 35 of the fiber 31 are cleaved substantially perpendicular to the fiber's longitudinal axis. The vertically emitted light 47 travels through the length of the fiber 31 and four percent of the optical power is reflected back from the far end 35 of the fiber 31 due to the fiber-air interface. This reflected light travels back toward the laser, exits the fiber 31 and enters back into the laser's second order grating where it is coupled to the original laser light. The amount of linewidth narrowing depends on two factors: the amount of power coupled back into the laser and the length of the external cavity. A longer external cavity results in higher cavity finesse and produces greater linewidth narrowing, with the fiber length limited only by the space available to the user. The linewidth is also narrowed as the power coupled back into the laser increases. The power is increased by decreasing the distance the fiber 31 is positioned from the top surface of the laser, increasing the reflectivity of end 35 of the fiber, or increasing the fiber's core diameter. However, the fiber's core cannot be too large or the fiber will support multiple spacial modes, thereby making the system more unstable. Whether a fiber supports one single mode or several modes will depend on wavelength, and is generally specified by the manufacturer. For example, 6 $\mu$m, 4.5 $\mu$m, and 3 $\mu$m core diameter fibers will all be single mode for a laser emission wavelength of 980 nm. The 6 $\mu$m core would be most desired because it is easier to couple light into a larger core fiber; however, linewidth narrowing can be obtained with both single-mode and multi-mode fibers. Experimental effects of each of these variables will be addressed later.

An alternate fiber configuration can also be used. A highly reflective coating, such as a multi-layer dielectric coating or a metallized coating such as gold, is deposited on end 35. This would result in greater reflection from end 35 which would allow more optical power to be reflected back into the laser cavity. In turn, this should allow for the use of shorter fiber lengths. The distance of end 33 from the laser's top surface, as well as the length and diameter of the optical fiber determine the amount of linewidth narrowing. The lens 43 focuses the forward emission 41 to a laser output beam 45. The lens is standard on laser systems and is not required for linewidth narrowing. A heat sink, not shown in FIG. 11 would also be used to dissipate heat and is standard in all semiconductor laser systems.

Figure 12:
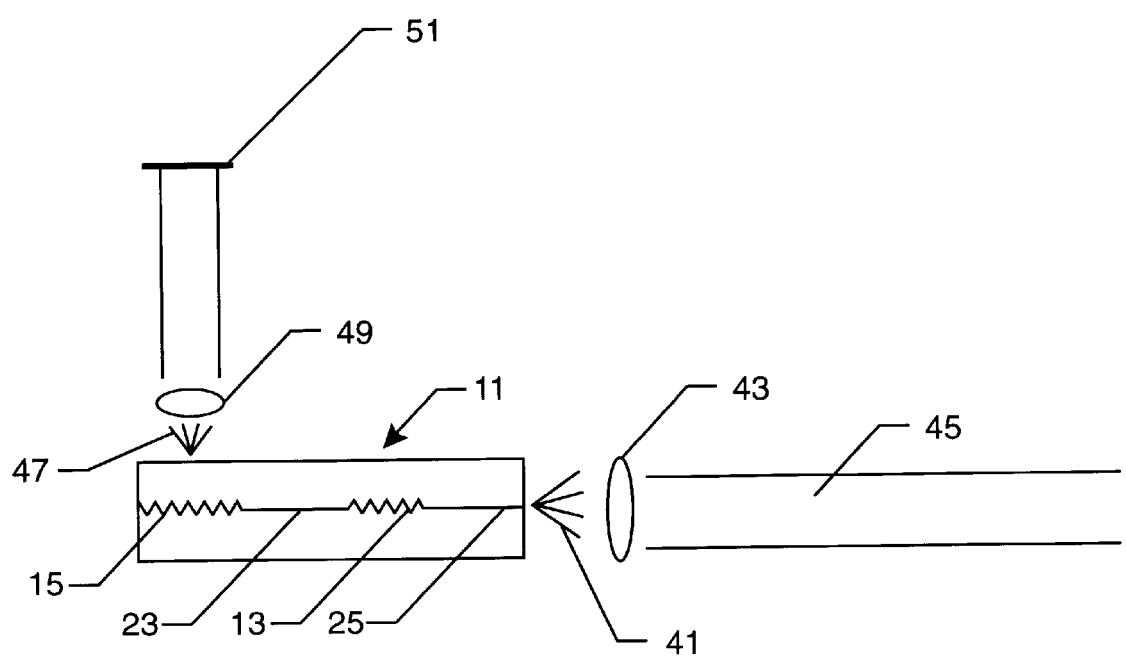
FIG. 12 shows an exemplary semiconductor laser set-up having an external cavity comprised of a lens and a mirror or grating.

FIG. 12 is an exemplary laser set-up having the external cavity configuration formed by a lens 49 and a highly reflective mirror or a standard diffraction grating 51. Greater linewidth narrowing occurs for greater distance between the lens and mirror or grating. The distance can range from a minimum of approximately one centimeter to as large as the user's system size constraints will allow. The distance of the lens 49 from the laser's top surface is equal to its focal length. An attenuator 50 could also be added between the lens and mirror/grating to control the amount of linewidth narrowing.

Figure 13A:
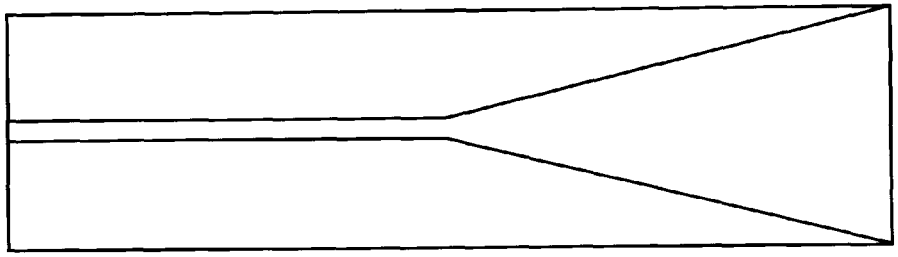
FIG. 13A shows the top view of an exemplary semiconductor laser set-up using a distributed Bragg MOPA semiconductor laser.
Figure 13B:
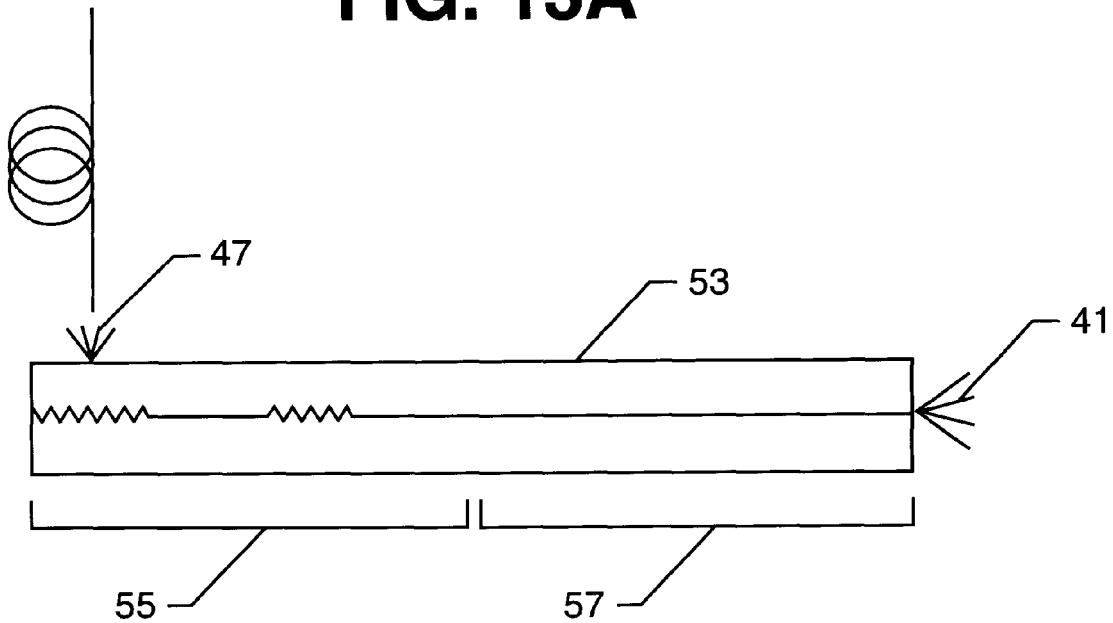
FIG. 13B shows the side view of an exemplary semiconductor laser set-up using a distributed Bragg MOPA semiconductor laser.

FIGS. 13A and 13B are an exemplary laser set-up using a distributed Bragg MOPA semiconductor laser 53. The MOPA 53 consists of a distributed Bragg reflector master oscillator 57 and a power amplifier section 55. FIG. 13A is a top view and FIG. 13B is a side view.

Figure 14:
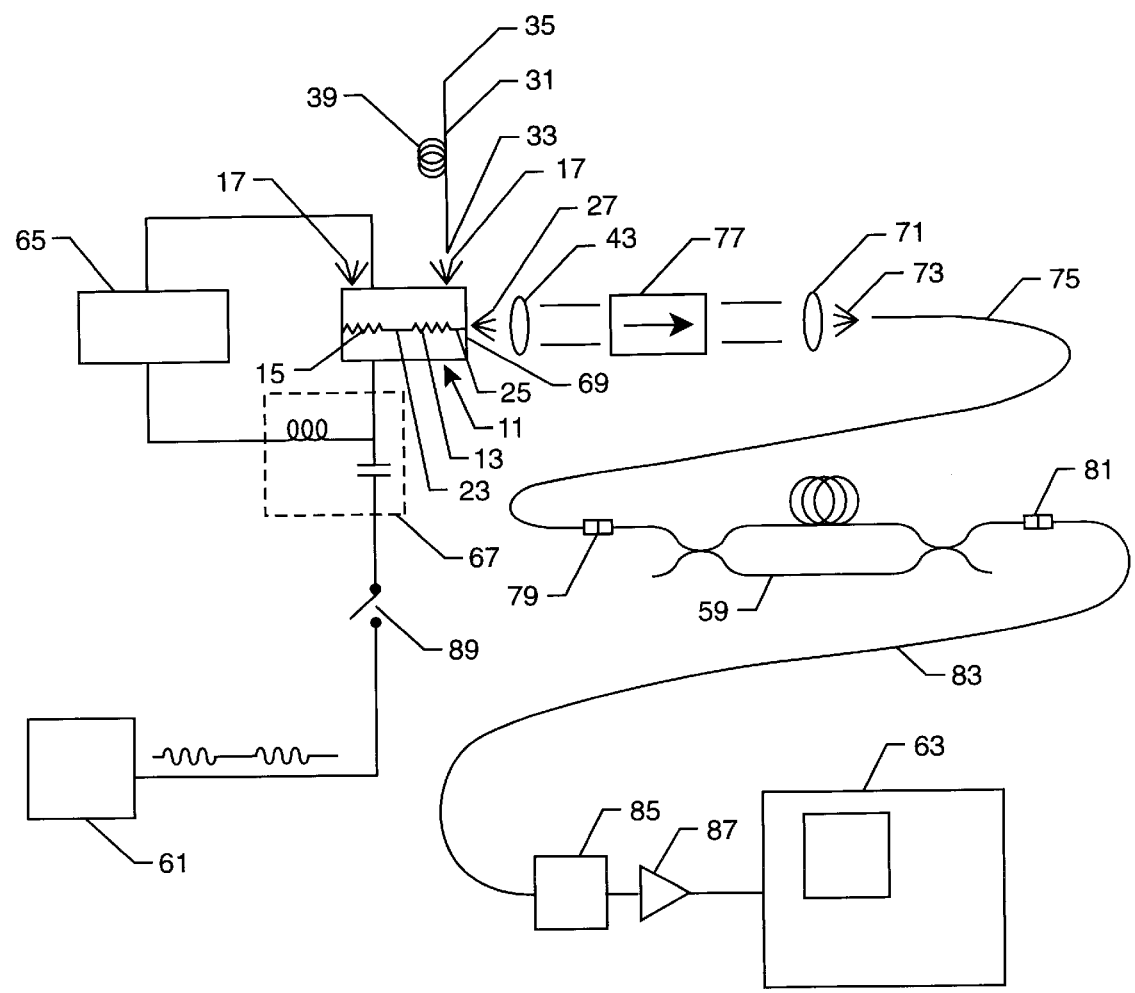
FIG. 14 is a diagram of the experimental set-up used to obtain reduced linewidths.

Linewidth reduction has been observed when an optical fiber external cavity is formed with the vertical emission of a distributed Bragg reflector laser. FIG. 14 is a diagram of the experimental set-up. A discussion of the experimental set-up and results may be found in Cook, et al., "Characteristics of Linewidth-Narrowed Distributed Bragg Reflector Lasers with a Fiber External Cavity Formed with the Vertical Grating Emission", Journal of Lightwave Technology, Vol. 13, No. 13, March 1995, incorporated herein by reference.

Figure 15:
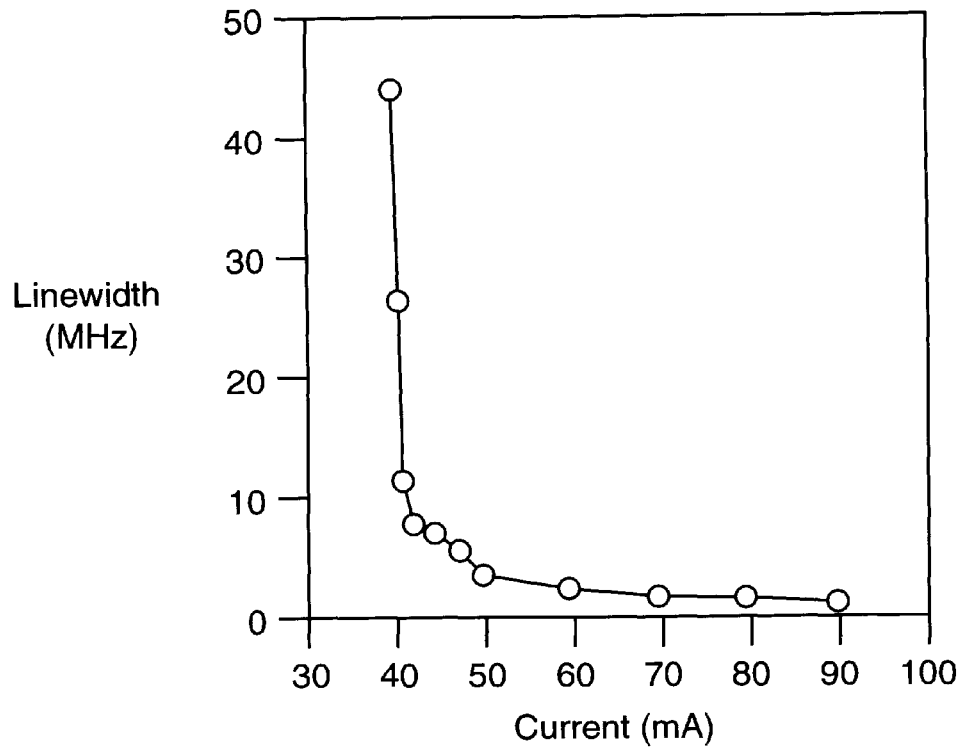
FIG. 15 is a graph of solitary linewidth versus current for the distributed Bragg reflector laser used in the experimental set-up.

A DBR semiconductor laser 11 with a preamplifier section 25 in front, capable of emitting 100 mW, was used. The total length of the laser was 1650 $\mu$m, which consisted of 500 $\mu$m for the back grating 15, 500 $\mu$m for the DBR gain section 23, 150 $\mu$m for the front grating 13, and 500 $\mu$m for the preamplifier gain section 25. The laser was mounted p-side down, and access to the vertical emission 17 was obtained through a window in the n-side metallization. One continuous window along the length of the device was present but the vertical emission from only the front or back grating at one time was utilized. Vertical emission from either worked well for linewidth narrowing. The device had a threshold current of 30 mA at 25 degrees Celsius. The emission wavelength of the laser was 980 nm. The vertical power emitted from each of the gratings was approximately one-sixteenth of the power emitted from the front facet. The linewidth versus current of the laser without the external cavity, i.e., the solitary linewidth, is shown in FIG. 15.

An optical fiber 31, cleaved at both ends 33 and 35 perpendicular to the fiber axis, was used to form the external cavity. The fiber 31 was positioned tens of microns from the top surface of the laser in order to couple optical power into the fiber 31. The optical power coupled back into the laser cavity was estimated to be −40 dB to −50 dB down from the vertical power emitted from the laser due to coupling loss into and out of the fiber 31 at the cleaved surface 33, and due to only four percent reflection at the cleaved surface 35. This was adequate power to narrow the linewidth of the laser. Fibers with core diameters of 6 $\mu$m, 9 $\mu$m, and 47 $\mu$m were investigated. The 6 $\mu$m fiber was Corning Flexcore 1060 fiber and was the only fiber that was single-mode for the emission wavelength of 980 nm. The 9 $\mu$m fiber was standard telecommunications-grade fiber. The large-core 47 $\mu$m fiber had a graded-index core. The effects of an external cavity on a semiconductor laser using single-mode fiber and multi-mode fiber are known in the art. Reduced linewidths were obtained with both types of fibers.

The linewidth was measured with a delayed self-homodyne fiber interferometer 59 that had a delay-leg length of 5 km, corresponding to a delay time of 25 $\mu$s. The linewidth resolution of this system was 40 kHz. Linewidths less than 40 kHz could be measured, but with some error. The error was such that the displayed linewidth was an overestimate of the actual linewidth. Correction factors were utilized to obtain corrected linewidths. Overestimation and its correction are well known in the art (see Cook, et al., previously incorporated by reference).

Since it is difficult to accurately view and measure narrow linewidths at baseband, an alternate method was used to offset the linewidth from baseband. This method consisted of using a gated sinewave generator 61 to modulate the laser diode with a gated small-signal sinewave and viewing the resulting self-homodyne waveform on an electrical spectrum analyzer 63. This method will be referred to as the gated-sinewave method. The dc current source 65 provided a dc bias current to the laser diode 11. The gated sinewave generator 61 provided a modulation signal to the laser diode 11. The two signals, dc bias and modulation, were combined with the bias-tee network 67. Using the bias-tee network 67 allowed independent control over the dc bias and the modulation of the laser diode 11.

The laser emitted a divergent beam 27 from its front facet 69. The divergent beam 27 was collimated with lens 43.

Lens 71 focused the light 73 into fiber 75. An optical isolator 77 was inserted between the two lenses, 43 and 71, to prevent unwanted reflections from disturbing the laser 11. Fiber 75 transmitted the light to the delayed self-homodyne interferometer 59. The fiber 75 was joined to the delayed self-homodyne interferometer 59 with optical connector 79. The delayed self-homodyne interferometer 59 works as follows. The light is split into two paths, a straight leg and a delayed leg, which have different path lengths. The light is now decorrelated and recombines into a single fiber from which it exits the self-homodyne interferometer 59. An optical connector 81 joins the self-homodyne interferometer 59 with a fiber 83 that transmits the decorrelated light to an optical detector 85 which converts the optical signal into an electrical signal. The electrical signal is amplified by amplifier 87 and then sent to an electrical spectrum analyzer 63. If the laser is operated dc with no modulation, then the switch 89 needs to be open and the linewidth signal on the electrical spectrum analyzer 63 will be centered at baseband (O Hz). If the laser is operated at a dc bias with modulation superimposed, then the switch 89 needs to be closed and the linewidth signal on the electrical spectrum analyzer 63 will be shifted away from baseband and centered at the frequency of the sinewave coming from the gated sinewave generator 61.

Figure 16:
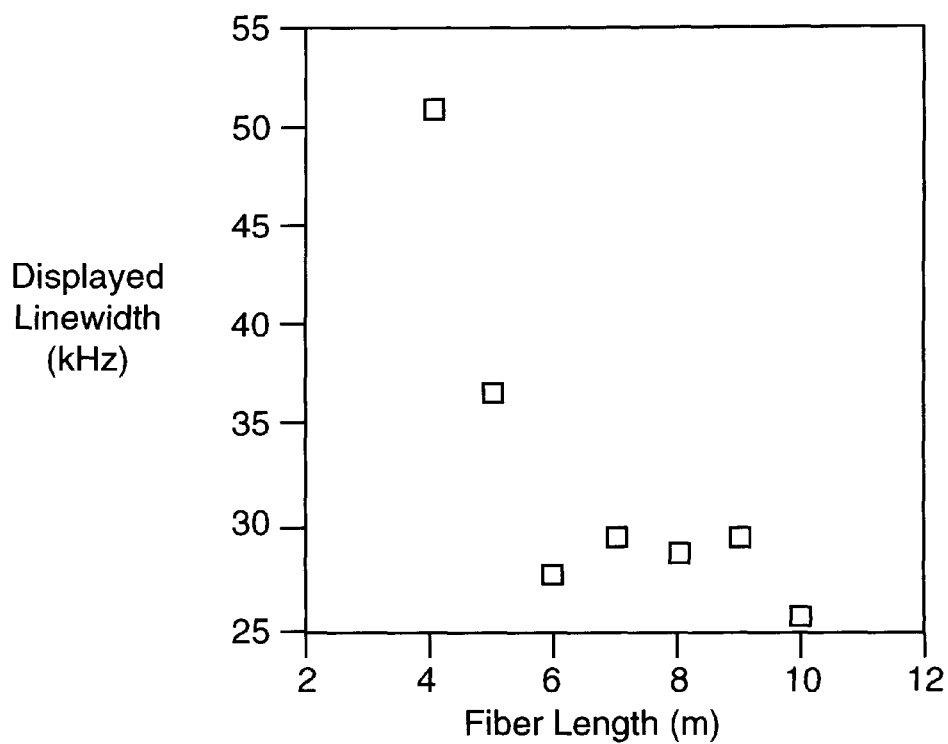
FIG. 16 is a graph of linewidth versus fiber length for a 6 μm core diameter fiber.
Figure 17:
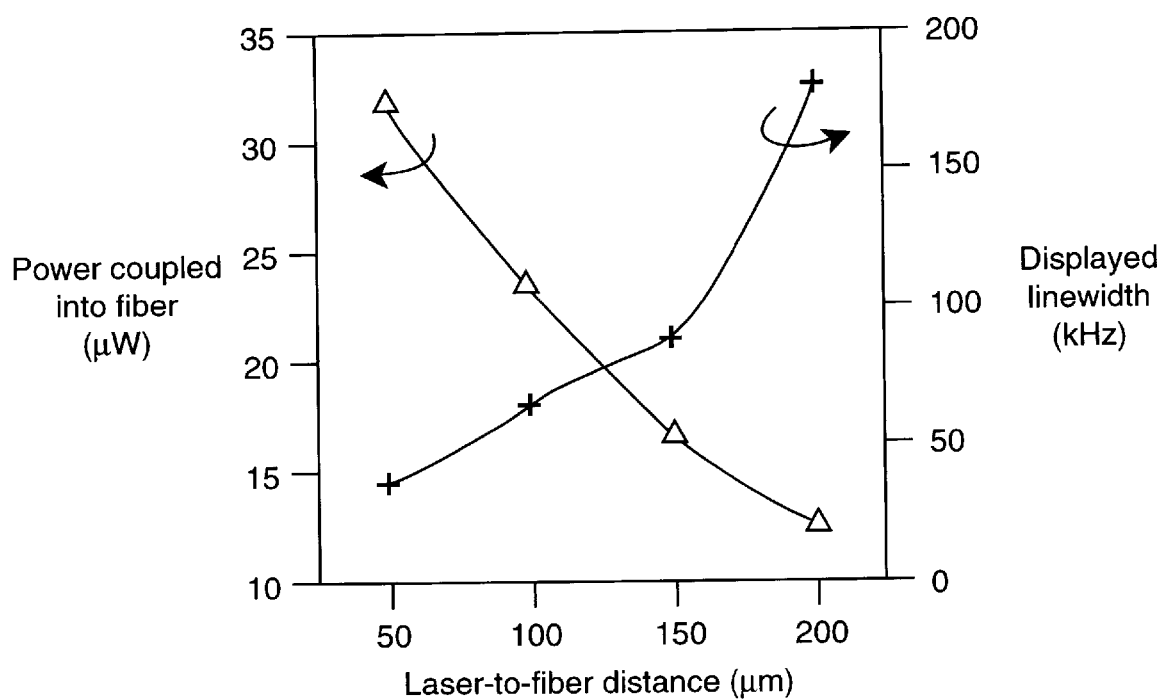
FIG. 17 is a graph of linewidth and fiber-coupled power versus laser-to-fiber distance for a 6 μm core diameter, 9 m length fiber.

The displayed linewidth versus fiber length for a 6 $\mu$m core diameter fiber, positioned 30 $\mu$m from the laser's top surface, is shown in FIG. 16. Displayed linewidths of less than 40 kHz were below the resolution limit of the measuring interferometer. A displayed linewidth as narrow as 26 kHz was measured for a fiber length of 10 meters. For fiber lengths of 6 meters or greater, a stable, narrow linewidth (less than 35 kHz) could be obtained. The term "stable" here refers to a displayed linewidth that did not greatly fluctuate in amplitude, width or position as viewed on the electrical spectrum analyzer. The linewidth started monotonically increasing as the fiber length became less than 6 meters. It was not possible to obtain stable, narrow linewidths for fiber lengths less than 2 meters. The linewidth and fiber-coupled power versus laser-to-fiber distance for a 6 $\mu$m core fiber, 9 meters in length are shown in FIG. 17. Similar results were obtained for 9 $\mu$m fibers. As the laser-to-fiber distance is increased, the fiber-coupled power decreases and the linewidth increases.

The amount of linewidth reduction is dependent on the laser's effective cavity length and the amount of optical power coupled back into the laser cavity. Thus for a given laser, operating with weak feedback levels (<−30 dB), the linewidth can be decreased by increasing either the length of the external cavity, or the amount of power coupled back into the laser cavity. This would not apply to medium feedback levels, where the linewidth goes broad, or chaotic. For medium feedback levels (approximately −30 dB to −10 dB), the laser can enter a regime where linewidth broadening greater than the solitary linewidth can occur. Strong amounts of feedback (>−10 dB, or 10%) can cause the linewidth to become very narrow again. The above feedback regimes and their effects on linewidth are known in the art. Feedback levels in this experiment were characterized by the weak regime, and linewidth rebroadening was never encountered. There was no measurable change in threshold current when the external fiber cavity was formed with the laser, supporting the fact that the amount of optical feedback was small.

The amount of power coupled back into the laser cavity, and thus the level of feedback, can be estimated as follows. When a length of 6-$\mu$m core fiber, cleaved on both ends, was placed 50 $\mu$m from the top of the laser which was operating at a current of 60 mA, approximately 32 $\mu$W could be coupled into the fiber. At a current of 60 mA, the laser vertically emitted 1.5 mW from one of the gratings. If 4% of the fiber-coupled power is reflected from the far end of the fiber, then approximately 1.3 $\mu$W is reflected back toward the laser, not all of which actually enters back into the laser cavity. If the entire 1.3 $\mu$W was coupled back into the laser cavity, then the optical power feedback ratio would be −31 dB. However, the actual feedback ratio probably lies in the range of −40 to −50 dB, due to coupling loss from the return light exiting the fiber and entering into the laser cavity.

The amount of power coupled into a 9 $\mu$m and 47 $\mu$m fiber was 60 $\mu$W and 280 $\mu$W, respectively. For the 6-$\mu$m and 9-$\mu$m fibers, the lateral position resulting in the highest fiber-coupled power also resulted in the narrowest linewidth, regardless of length. For the 47-$\mu$m fiber, the lateral position resulting in the highest fiber-coupled power did not always correspond to the minimum linewidth. Also, in general, the 47-$\mu$m core fibers resulted in linewidths that were more unstable and sensitive to mechanical perturbations to the fiber than the 6 $\mu$m and 9 $\mu$m core fibers, due to the multi-mode fiber supporting several modes traveling down the fiber and the modes shifting with mechanical perturbations. The laser-to-fiber distance affected the linewidth more drastically for the 6-$\mu$m and 9-$\mu$m fibers than for the 47-$\mu$m fiber.

Long lengths of fiber were needed to obtain narrow linewidths because the amount of optical feedback was small. Long lengths of fiber correspond to more closely spaced external-cavity longitudinal modes and increased chance of mode-hopping among those external cavity modes, due to slight changes in ambient conditions or laser conditions. Shorter external cavities should exhibit a more stable longitudinal-mode structure, but the optical feedback amount would need to be increased to maintain the same level of feedback. Increasing the amount of power fed back to the laser by increasing the reflectivity of the far end of the fiber, by applying a highly reflective coating, should allow use of a shorter fiber while still maintaining a narrow linewidth.

Obviously, numerous additional modifications and variations of the present invention are possible in light of above teachings. It is therefore to be understood that within the scope of the appended claims, the invention may be practiced otherwise than is specifically described herein.

We claim:

1. A linewidth-reducing semiconductor laser system comprising:

a distributed feedback semiconductor laser having a second order grating and vertical emission, and having a metallized contact, said metallized contact having at least one window through which said semiconductor laser vertically emits light;

an external cavity means for coupling said vertically emitted light back into said semiconductor laser, wherein said external cavity means comprises a lens in close proximity to the top surface of said laser and a mirror positioned along an axis extending outwardly from said lens and substantially perpendicular to the top surface of said laser;

an attenuator positioned between said lens and said mirror;

a dc current source for supplying current to said metallized contact of said semiconductor laser; and a heat sink operatively connected to said semiconductor laser to dissipate heat produced by said semiconductor laser.

2. A linewidth-reducing semiconductor laser system comprising:

a distributed Bragg reflector semiconductor laser having at least one second order grating and vertical emission, and having a metallized contact, said metallized contact having at least one window through which said semiconductor laser vertically emits light;

an external cavity means for coupling said vertically emitted light back into said semiconductor laser, wherein said external cavity means comprises a lens in close proximity to the top surface of said laser and a mirror positioned along an axis extending outwardly from said lens and substantially perpendicular to the top surface of said laser;

an attenuator positioned between said lens and said mirror;

a dc current source for supplying current to said metallized contact of said semiconductor laser; and a heat sink operatively connected to said semiconductor laser to dissipate heat produced by said semiconductor laser.

3. A linewidth-reducing semiconductor laser system comprising:

a distributed feedback semiconductor laser having a second order grating and vertical emission, and having a metallized contact, said metallized contact having at least one window through which said semiconductor laser vertically emits light;

an external cavity means for coupling said vertically emitted light back into said semiconductor laser, wherein said external cavity comprises a lens in close proximity to the top surface of said laser and a grating positioned along an axis extending outwardly from said lens and substantially perpendicular to the top surface of said laser;

an attenuator positioned between said lens and said grating;

a dc current source for supplying current to said metallized contact of said semiconductor laser; and a heat sink operatively connected to said semiconductor laser to dissipate heat produced by said semiconductor laser.

4. A linewidth-reducing semiconductor laser system comprising:

a distributed Bragg reflector semiconductor laser having at least one second order grating and vertical emission, and having a metallized contact, said metallized contact having at least one window through which said semiconductor laser vertically emits light;

an external cavity means for coupling said vertically emitted light back into said semiconductor laser, wherein said external cavity comprises a lens in close proximity to the top surface of said laser and a grating positioned along an axis extending outwardly from said lens and substantially perpendicular to the top surface of said laser;

an attenuator positioned between said lens and said grating;

a dc current source for supplying current to said metallized contact of said semiconductor laser; and a heat sink operatively connected to said semiconductor laser to dissipate heat produced by said semiconductor laser.

* * * * *